(12) United States Patent
Gaillard et al.

(10) Patent No.: US 8,017,025 B2
(45) Date of Patent: Sep. 13, 2011

(54) METHOD FOR PRODUCING AIR GAPS USING NANOTUBES

(75) Inventors: Frederic-Xavier Gaillard, Voiron (FR); Jean-Christophe Coiffic, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 796 days.

(21) Appl. No.: 12/149,879

(22) Filed: May 9, 2008

(65) Prior Publication Data
US 2008/0283497 A1 Nov. 20, 2008

(30) Foreign Application Priority Data

May 15, 2007 (FR) ...................................... 07 03487

(51) Int. Cl.
*C23F 1/00* (2006.01)
(52) U.S. Cl. .......................................... 216/39; 977/888
(58) Field of Classification Search .................... 216/39, 216/58, 83; 438/689; 257/E21.581; 427/198, 427/552, 197; 977/742, 842, 938
See application file for complete search history.

(56) References Cited

U.S. PATENT DOCUMENTS

| 7,172,980 B2 | 2/2007 | Torres et al. | |
| 2005/0124172 A1 | 6/2005 | Townsend, III et al. | |
| 2006/0278901 A1 * | 12/2006 | Dangelo et al. | 257/276 |
| 2007/0248758 A1 * | 10/2007 | Ward et al. | 427/271 |

OTHER PUBLICATIONS

Gosset et al. "General review of issues and perspectives for advanced copper interconnections using air gap as ultra-low K material." Proceedings of the IEEE, 2003, International Interconnect Technology Conference, 2003, pp. 65-67.
Hoofman et al. "Benefits and Trade-offs in Multi-Level Air Gap Integration." Spring MRS San Diego, Apr. 2006.
Majumder et al. "Enhanced flow in carbon nanotubes." *Nature*, vol. 438, Nov. 3, 2005, p. 44.

* cited by examiner

*Primary Examiner* — Nadine G Norton
*Assistant Examiner* — Patti Lin
(74) *Attorney, Agent, or Firm* — Oliff & Berridge, PLC

(57) ABSTRACT

A target layer comprising at least one degradable material is deposited on a support. Nanotubes are then formed on the degradable material of the target layer before deposition of an insulating layer is performed. Degradation of the degradable material and elimination of degradation sub-products are then performed by means of the nanotubes passing through the insulating layer thus forming air gaps in the target layer.

10 Claims, 4 Drawing Sheets

METHOD FOR PRODUCING AIR GAPS USING NANOTUBES

BACKGROUND OF THE INVENTION

The invention relates to a method for producing air gaps in a target layer successively comprising:
- fabrication of the target layer comprising at least one degradable material,
- deposition of an insulating layer above the target layer,
- and selective degradation of predetermined zones of the target layer through the insulating layer, said zones forming said air gaps.

STATE OF THE ART

Nowadays, integrated electronic circuits present a non-negligible proportion of metallic elements. The latter can be used as interconnection elements, antennas, coils or inductors. With the reduction of the distances separating the metallic layers, the electrostatic or electromagnetic couplings increase between these elements, which has the effect of modifying their electrical behavior. In a general manner, these electrostatic couplings are modelled by the appearance of at least one stray capacitance between the metallic elements. Reducing the coupling requires the dielectric permittivity of the material situated between said metallic elements to be reduced.

For current generations of integrated circuits, the use of low-permittivity dielectric materials (about 2.3 to 2.7) is compatible with the performances sought for. These low-permittivity dielectric materials advantageously replace silicon oxides. However, for the forthcoming technological generations (nodes smaller than 32 nm), the performance requirements are considerably greater than the small improvement of the permittivity currently measured on deposited bulk materials. The use of air gaps in interconnection structures today seems inevitable. With such architectures, the air gaps present between the conductor lines give permittivities equal to 1.

A possible means at the present time for fabricating these air gaps is the use of non-conformal deposition of dielectric on interline layers of metallic material. This approach, described by Gosset et al. ("General review of issues and perspectives for advanced copper interconnections using air gap as ultra-low K material", Proceedings of the IEEE, 2003, International Interconnect Technology Conference (2003) 65), enables the required air gaps to be obtained under certain fabrication conditions with an excess of complex and costly technological steps.

Another envisaged solution consists in integrating a sacrificial material between the metallic material patterns, thereby forming the intermetallic level. This material reacts after it has been integrated by means of various physico-chemical processes (thermal annealing, UV radiation treatment ("Benefits and Trade-offs in Multi-Level Air Gap Integration", Spring MRS San Diego, April 2006), or chemical etching (U.S. Pat. No. 7,172,980). In this way, integration of the interconnection levels with the sacrificial material can be totally or partly achieved, and the air gaps can then be formed. However, this approach greatly limits the scope of materials able to be used for performing integration. The sacrificial material which has to make way for the air gap does in fact have to be compatible with semi-conductor technology, be degradable and, when it is removed, the physico-chemical processes used must not damage the electronic devices that have already been integrated (CMOS transistors, capacitors . . . ). Likewise, the materials adjacent to the sacrificial material must present a resistance to these physico-chemical processes in order not to be damaged, but some of these materials have to allow degradation and removal of the sacrificial material by being for example permeable to the multiple chemical processes.

OBJECT OF THE INVENTION

The object of the invention is to provide a sequence of technological steps aiming to alleviate the above-mentioned shortcomings. More particularly, the object of the invention is to provide a fabrication method that is less complex and less costly.

According to the invention, this object is achieved by the fact that, before deposition of the insulating layer, the method comprises formation of nanotubes on the target layer, a majority of nanotubes passing through the insulating layer and forming passages between the target layer and the outside.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF A PREFERRED EMBODIMENT OF THE INVENTION

Figure 1:
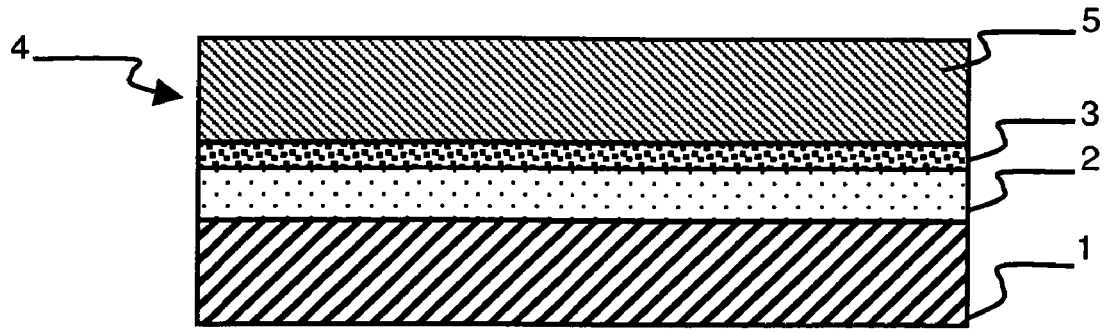
FIGS. 1 to 5 represent the successive steps of a first particular embodiment of the method according to the invention.

In the first particular embodiment, as illustrated in FIG. 1, a target layer 4 is produced on a substrate 1, which may comprise multiple layers 1, 2 and 3. In this particular embodiment, the target layer 4 is solely composed of a degradable material 5. The degradable material 5 is for example silicon dioxide ($SiO_2$) which can be degraded by chemical etching or a thermally degradable polymer such as polymethyl-methacrylate or alpha-terpinene.

Figure 2:
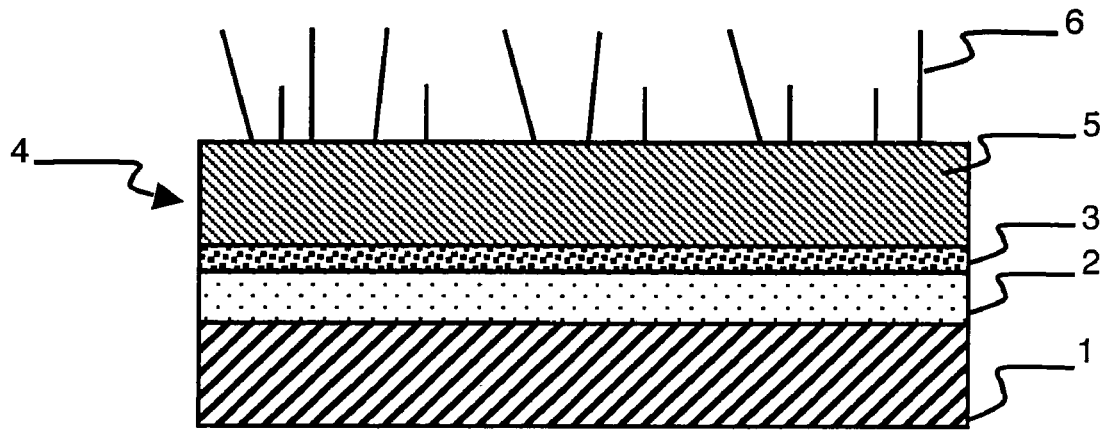

As illustrated in FIG. 2, nanotubes 6 are formed on the target layer 4, by any known method for example by catalytic means, by high-temperature electric discharge or by laser ablation. The nanotubes 6 then present one end in contact with the sacrificial material 5. The nanotubes 6 are for example carbon nanotubes or titanium oxide nanotubes and are preferably of hollow cylindrical shape. The nanotubes 6 are not necessarily strictly vertical and can also be bent. Most of the nanotubes 6 are substantially perpendicular to the surface of the target layer 4 on which they are formed.

Figure 3:
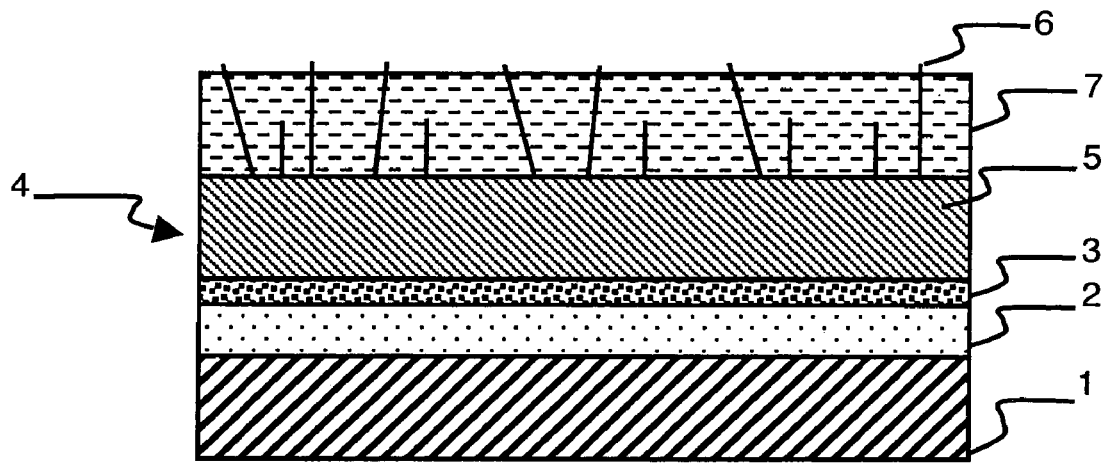

As illustrated in FIG. 3, an insulating layer 7 is then deposited on the target layer 4 and the nanotubes 6. Depending on the deposition conditions of the insulating layer 7, the nanotubes 6 can then present a free end or not, i.e. an end not coated by the insulating layer 7. In the case where most of the nanotubes 6 do not pass right through the insulating layer 7, an additional step (not represented) is required to release a free end of the nanotubes 6. Most of the nanotubes then pass though the insulating layer and form passages between the target layer 4 and the outside. This additional step is performed by any known means and can for example be achieved by chemical mechanical polishing, plasma etching or wet etching which specifically eliminates the insulating layer 7.

The Insulating layer 7 is preferably sufficiently rigid (sufficiently dense and with a suitable Young's modulus) so as not to deform, or to deform very little, once air gaps have been formed in the target layer 4. Likewise, the insulating layer 7 is chosen such as not to be etched when the degradation process of the degradable material 5 is performed. Layer 7 is preferably impervious to the chemical etching agent used to degrade material 5 and to the degradation sub-products. The top layer 3 of the substrate 1 is advantageously also in contact with the degradable material 5 which presents the same characteristics as the insulating layer 7.

The structure thus formed is subjected to degradation agents 10 of the degradable material 5. This degradation can for example be performed by any known method, for example by a thermal method, by radiation (for example ultraviolet radiation) or by any suitable undulatory phenomenon or by chemical etching by an agent in liquid or gaseous form.

Figure 4:
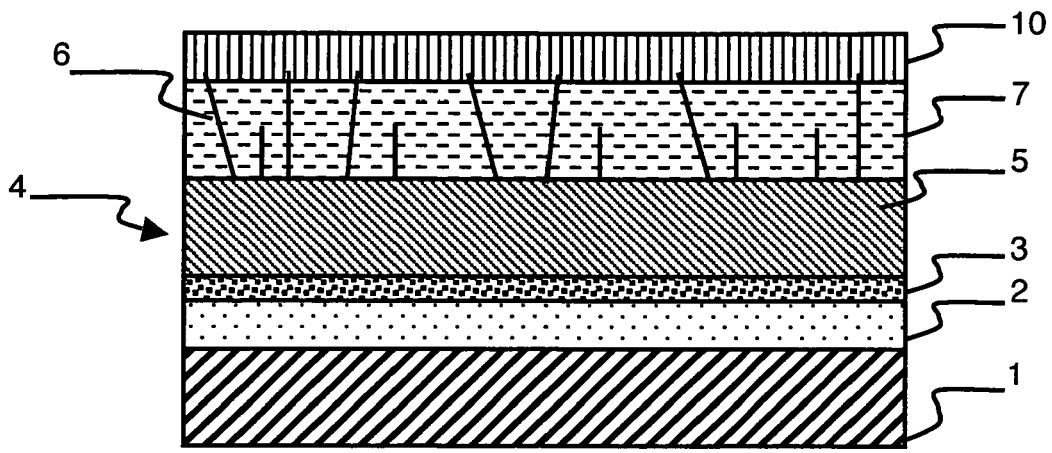

As illustrated in FIG. 4, in the case of chemical etching by an agent 10 in liquid form, the agent 10 can for example be in the form of a solution on the insulating layer 7. The agent 10 can then degrade the sacrificial material 5 through the nanotubes 6 passing through the insulating layer 7, the nanotubes thus forming passages for the liquid or gas between the target layer and the outside. Formation of nanotubes designed to act as passage for a gas or a liquid in the biology field has in particular been described in the article "Enhanced flow in carbon nanotubes", Nature, 438 (2005) 44. The characteristics of the nanotubes 6, in particular their diameter, are defined in the case of chemical etching such as to enable an agent 10 able to degrade the degradable material 5 to pass there-through. If thermal or undulatory degradation of the degradable material 5 is used, the nanotubes 6 are not used by the degradation agent. However, in all other cases, the characteristics of the nanotubes 6 must be chosen such as to enable the degradation sub-products of the degradable material 5 to be eliminated to the outside via the nanotubes. When the nanotubes 6 are carbon nanotubes, diffusion of the degradation agent and/or of the degradation sub-products by means of the nanotubes takes place either between the graphene planes, or at the nanotube-insulating layer interface, or in the hollow channel of the nanotube 6. The nanotubes 6 can also for example be nanotubes made of titanium oxide, or gallium nitride or rare earth compound-based Advantageously, if completely hollow nanotubes 6 are to be produced by catalytic means, the catalyst grains used for formation thereof can be eliminated for example by means of an acid solution (for example nitric acid $HNO_3$).

Moreover, the nanotubes 6 can also be partially degraded before or during degradation of the degradable material 5 so as to enlarge the passage formed by the nanotubes 6. The nanotubes 6 can also be totally eliminated before degradation of material 5 is performed, the passages then being formed by holes present in the insulating layer 7. The nanotubes 6 can then be eliminated for example by plasma or by chemical solution depending on their nature. For example, for carbon nanotubes, an oxygen-based plasma will be used.

Figure 5:
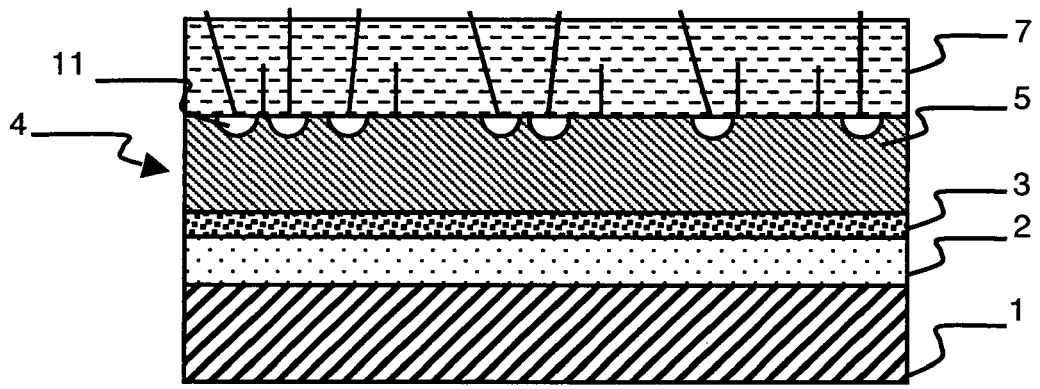

Formation of passages between the target layer 4 and the outside, formed in the insulating layer 7 by the nanotubes or corresponding holes, thus enables a chemical agent 10 to reach and degrade the degradable material 5 and, after degradation of material 5, enables the degradation residues to be eliminated through the insulating layer 7 to create air gaps 10 at the foot of each pass-through nanotube, as illustrated in FIG. 5.

In the case where the degradable material 5 is formed by silicon oxide, degradation thereof can be achieved by means of hydrofluoric acid. The material of layers 3 and 7 is then chosen such as not to react with hydrofluoric acid and layers 3 and 7 are then for example made from silicon nitride or silicon carbide. Layer 7 can for example be made from BD1® marketed by Applied Materials.

Figure 6:
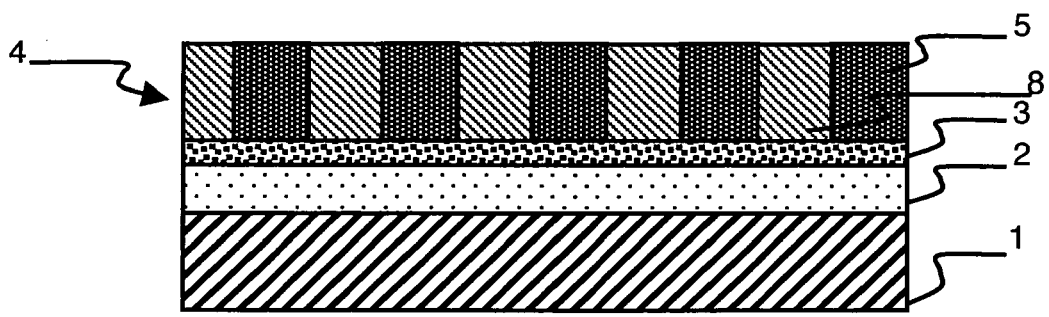
FIGS. 6 to 9 represent the successive steps of a second embodiment of the method according to the invention.

In a second embodiment illustrated in FIG. 6, patterns (for example contact pads or lines) achieved by an alternation of patterns made from predefined material 8 and from degradable material 5 are integrated within the target layer 4 over the whole height thereof.

For example, to integrate air gaps in a metallic interconnection structure, the target layer 4 is formed by an alternation of patterns made from the degradable material 5 (for example silicon oxide) and a predefined material 8, for example metallic (for example copper). This alternation is performed in known manner, for example by the damascene method. Layer 2 can then comprise a set of active electronic devices, for example CMOS transistors, arranged on a silicon substrate 1. An encapsulation and planarization layer 3 can be arranged on this layer 2.

Figure 7:
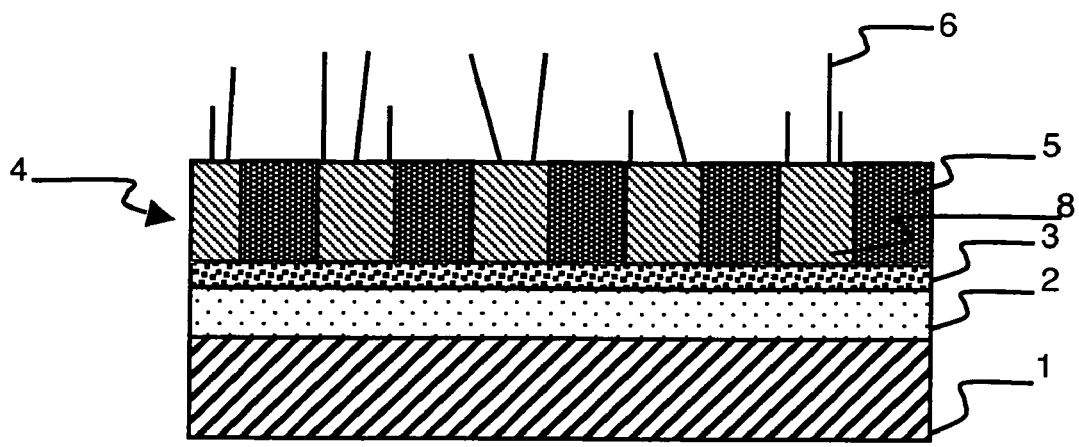

As illustrated in FIG. 7, nanotubes 6 are then produced on the target layer 4. The nanotubes 6 present a length that is preferably comprised between 50 and 300 nm. The deposition method of the nanotubes 6 is chosen such that the nanotubes 6 are preferably deposited on the degradable material 5 and not on material 8. In this configuration, the nanotubes 6, for example made of carbon, are preferably produced by catalytic means. The choice between a chemical vapor deposition method and a plasma enhanced chemical vapor deposition method is made according to the characteristics required for the nanotubes 6.

The diameter of nanotubes 6 is chosen according to the required application and according to the degradation method and the sub-products arising therefrom, typically between 1 nm and 300 nm. In fact, the wider nanotube 6 is, the easier diffusion of the chemical species (agent 10) is. Likewise, the degradation sub-products are liable to be removed more rapidly if nanotube 6 is wide.

If very localized etching is required, the use of thin nanotubes 6 and of suitable degradation methods (relatively short chemical etching or annealing time) will be favored. If on the contrary, broad gaps are sought to be achieved under nanotubes 6, then wide nanotubes 6 will be produced, possibly with a highly concentrated chemical degradation agent 10, or a longer etching time will be used. The person skilled in the art will adapt the etching time to the chemical etching solution concentration.

The density of nanotubes 6 is also chosen according to the required application, the density of nanotubes 6 preferably being comprised between 0.3 nanotubes/$nm^2$ and $10^{-4}$ nanotubes/$nm^2$. If the nanotube density is too great, the insulating layer 7 does not coat each nanotube individually, and in this case the etching solution diffuses between the nanotubes 6.

Figure 8:
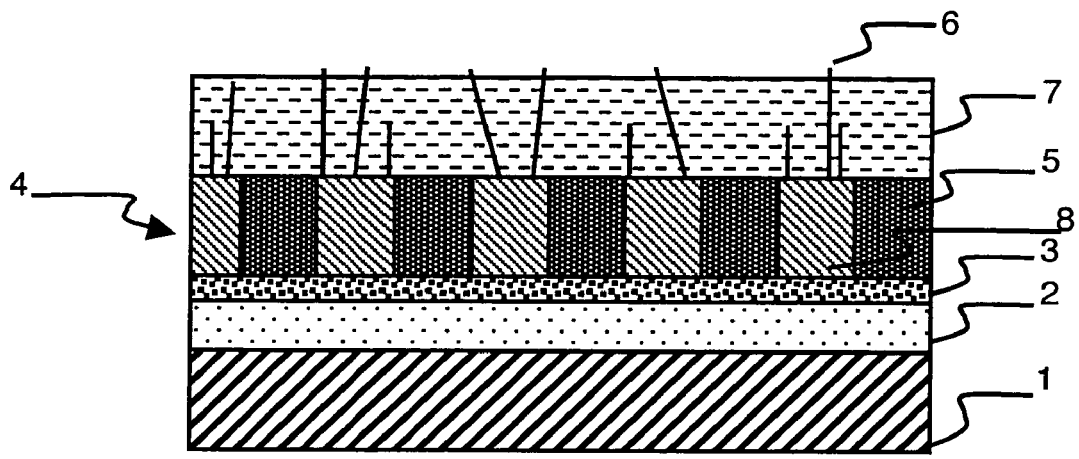

As illustrated in FIG. 8, the insulating layer 7 is deposited at least on the target layer 4 and on the nanotubes 6. This insulating layer 7 is preferably made from dielectric material and advantageously from dielectric material with a low dielectric constant (in the 2 to 5 range). This insulating layer 7 has a thickness typically in the 20-500 nm range.

Advantageously, the insulating layer 7 is of Methylsilsesquioxane type and more particularly made from BD1® material marketed by Applied Materials. If the insulating layer 7 completely coats the nanotubes 6, an additional step can be implemented to free one end of nanotubes 6.

Figure 9:
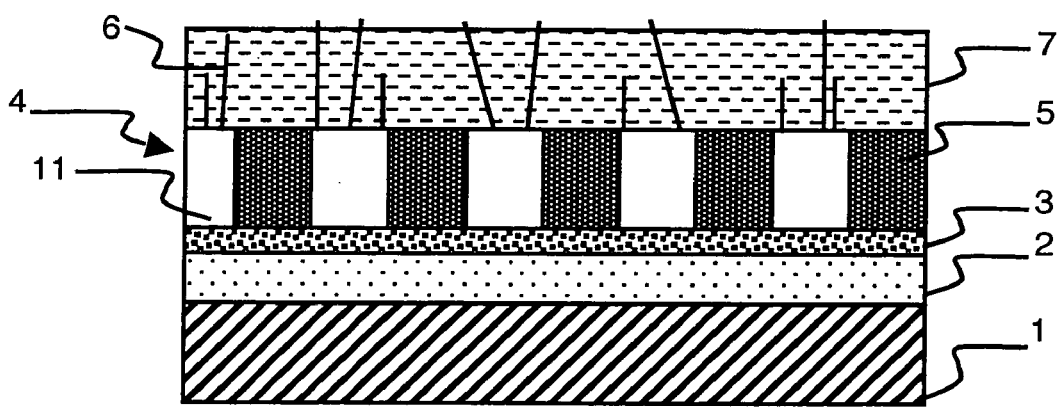

Once this architecture has been obtained, degradation of the degradable material 5 is performed as before. Degradation and elimination of material 5 is preferably total. As illustrated in FIG. 9, the air gaps 11 thus formed in the target layer 4 then totally replace the degradable material 5, which thus forms a sacrificial material. The air gaps 11 are then determined by the patterns formed beforehand in layer 4 and delineated by the zones initially filled by material 5.

In a variant of this embodiment, material 5 is thermally degradable, the other materials being able to remain unchanged. The degradable material 5 is then for example of polymer type (for example made of polymethyl methacrylate PMMA, of pore-forming type made of Norbornadiene or alpha-terpinene . . . ). In this approach, the structure is then heated so as to perform thermal degradation of the degradable material 5. The degradation sub-products can then diffuse out of target layer 4 by means of the nanotubes 6 acting as passages.

Figure 10:
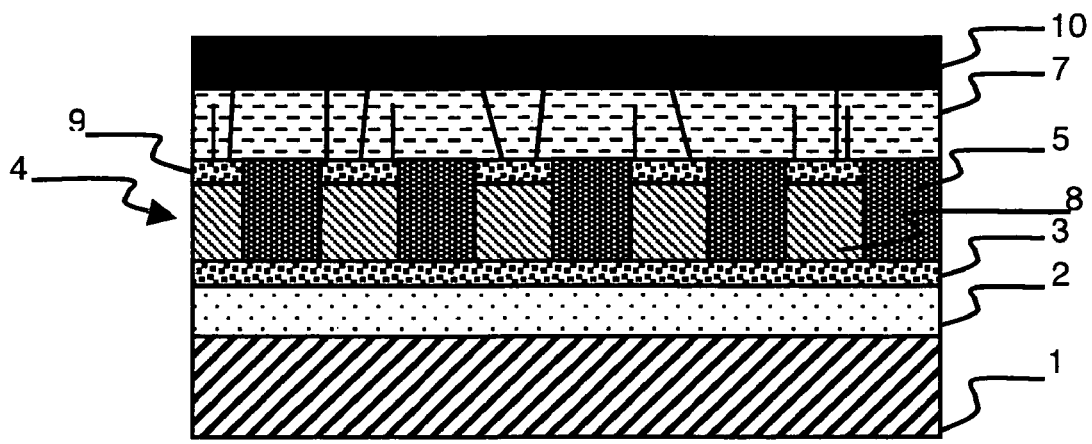
FIGS. 10 to 12 represent various steps of a third embodiment of the method according to the invention.

In a third embodiment illustrated by FIG. 10, the target layer 4 comprises an additional degradable material 9 deposited on the degradable material 5. Then patterns (for example contact pads or lines) made of predetermined material 8, preferably metallic, for example copper, are integrated inside this layer 4 and over the whole height thereof. This integration can be achieved by any known technique, for example by the damascene technique. Layer 4 is then formed by an alternation of metallic material 8 and stack of degradable material 5 and additional degradable material 9. Materials 5 and 9 have different degradation characteristics.

The additional degradable material 9 is preferably chosen such as to facilitate deposition of the nanotubes 6. For example, the degradable material 5 can be a thermally degradable material such as PMMA, p-SILK®, Spin On Glass or PhiLK®) particularly suitable for the required application. The additional degradable material 9 is then for example a chemically degradable material such as silicon oxide, which makes production of the nanotubes 6 much easier than the degradable material 5. The carbon nanotubes 6 are then formed on the additional degradable material 9.

Figure 11:
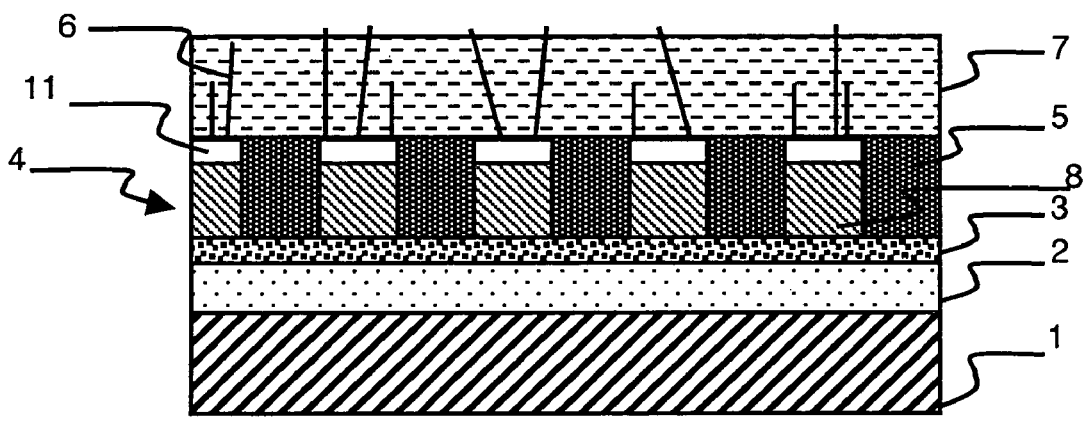
Figure 12:
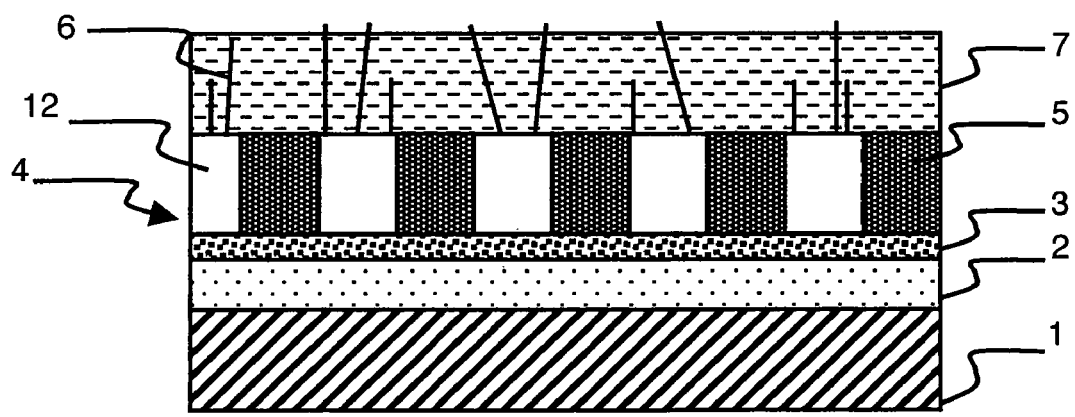

As illustrated in FIG. 11, degradation of additional degradable material 9 and removal of the latter are performed after deposition of an insulating layer 7. A hydrofluoric acid solution is preferably used to eliminate the patterns made of additional degradable material 9 at least partially and to form air gaps 11 in the zones initially filled by material 9. Degradation and removal of degradable material 5 are then performed. Thermal degradation is preferably used. The degradable material 5 and the additional degradable material 9 having both been eliminated, the air gaps 12 are thereby formed between the patterns of metallic material 8, as illustrated by FIG. 12, in all the zones initially filled by materials 5 and 9.

Superposition of two degradable materials having different degradation characteristics enables the degradation rate and the formation conditions of nanotubes 6 to be optimized.

The invention claimed is:

1. A method for producing air gaps in a target layer successively comprising:
    fabricating the target layer comprising at least one degradable material,
    forming nanotubes on the target layer,
    depositing an insulating layer above the target layer, a majority of nanotubes passing through the insulating layer and forming passages between the target layer and the outside,
    and degrading selectively predetermined zones of the target layer through the insulating layer, said zones forming said air gaps.

2. The method according to claim 1, wherein the nanotubes comprise an end in contact with the target layer, the method comprising a step of freeing the other end of the nanotubes after the insulating layer has been deposited.

3. The method according to claim 1, wherein selectively degrading the degradable material is performed by chemical etching by means of the nanotubes, the insulating layer being impervious to said chemical agent.

4. The method according to claim 1, wherein selectively degrading the degradable material is performed by a thermal process.

5. The method according to claim 1, wherein selectively degrading of the degradable material is performed by radiation.

6. The method according to claim 1, wherein the nanotubes are carbon nanotubes.

7. The method according to claim 1, wherein the nanotubes are titanium oxide nanotubes.

8. The method according to claim 1, wherein the target layer presents an alternation of patterns made from degradable material and non-degradable material.

9. The method according to claim 8, wherein the patterns made from degradable material are formed by at least two superposed degradable materials presenting different degradation characteristics.

10. The method according to claim 8, wherein forming the nanotubes is performed essentially on the degradable material.

* * * * *